US007722365B2

(12) United States Patent
Honda

(10) Patent No.: US 7,722,365 B2
(45) Date of Patent: May 25, 2010

(54) CONNECTOR AND ELECTRONIC CONTROL APPARATUS HAVING THE SAME

(75) Inventor: Takayoshi Honda, Nagoya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 12/318,179

(22) Filed: Dec. 23, 2008

(65) Prior Publication Data

US 2009/0176402 A1 Jul. 9, 2009

(30) Foreign Application Priority Data

Jan. 7, 2008 (JP) ............................ 2008-000759

(51) Int. Cl.
*H01R 12/00* (2006.01)
*H05K 1/00* (2006.01)

(52) U.S. Cl. ........................................................ 439/78

(58) Field of Classification Search ............. 439/78–83; 174/260; 361/760
See application file for complete search history.

(56) References Cited

U.S. PATENT DOCUMENTS 5,177,668 A * 1/1993 Lederer et al. .............. 361/719
5,647,749 A 7/1997 Atoh et al.
5,827,077 A 10/1998 Fukuda
6,505,402 B2 1/2003 Moriwake et al.
6,506,063 B1 1/2003 Moriwake et al.
6,942,504 B2 9/2005 Shinozaki et al.
7,400,511 B2 * 7/2008 Ito et al. ..................... 361/760
2001/0006854 A1 7/2001 Moriwake et al.
2007/0193774 A1 * 8/2007 Ito et al. ..................... 174/260
2007/0264851 A1 11/2007 Honda et al.
2008/0144260 A1 * 6/2008 Honda ........................ 361/679
2008/0146051 A1 * 6/2008 Honda ......................... 439/66
2009/0068862 A1 * 3/2009 Honda ......................... 439/78

FOREIGN PATENT DOCUMENTS

JP U-H7-36382 7/1995
JP 11-149963 A 6/1999
JP 11-317265 A 11/1999
JP A-2000-164273 6/2000
JP A-2000-215951 8/2000
JP A-2006-107817 4/2006
JP A-2007-179974 7/2007

OTHER PUBLICATIONS

U.S. Appl. No. 11/979,972, filed Nov. 13, 2007, Honda.

(Continued)

*Primary Examiner*—Chandrika Prasad
(74) *Attorney, Agent, or Firm*—Posz Law Group, PLC

(57) ABSTRACT

In a connector, a connector terminal has a first portion partially supported by a connector housing to be parallel to a wiring board, a second portion exposed outside the housing to be parallel to the board and located closer to the board than the first portion, a joint portion having a first end joined to the first portion and a second end exposed outside the housing and joined to the second portion, and a contact portion soldered to a corresponding land of the board. The first portion of a first terminal is located farther from the board than the first portion of a second terminal. The joint portions of the first and second terminals are located at different distances from the housing. The joint portion of the first terminal is supported by the housing between the first portions of the first and second terminals.

17 Claims, 6 Drawing Sheets

OTHER PUBLICATIONS

U.S. Appl. No. 12/222,321, filed Aug. 7, 2008, Honda et al.

U.S. Appl. No. 12/222,327, filed Aug. 7, 2008, Honda.

Office Action issued from the Japanese Patent Office dated Dec. 8, 2009 in the corresponding application No. 2008-000759 (with English translation).

* cited by examiner

CONNECTOR AND ELECTRONIC CONTROL APPARATUS HAVING THE SAME

CROSS REFERENCE TO RELATED APPLICATION

This application is based on and incorporates herein by reference Japanese Patent Application No. 2008-759 filed on Jan. 7, 2008.

FIELD OF THE INVENTION

The present invention relates to a connector adapted to be mounted on a wiring board and also relates to an electronic control apparatus having the connector and the wiring board.

BACKGROUND OF THE INVENTION

As disclosed in, for example, JP-A-2000-164273, a through-hole connector is mounted on a wiring board such that terminals of the through-hole connector are inserted into through holes in the wiring board and soldered to lands in the through holes. As disclosed in, for example, JP-A-2007-179974, a surface-mount connector is mounted on a wiring board such that terminals of the through-hole connector are soldered to lands on a surface of the wiring board.

In the through-hole connector disclosed in JP-A-2000-164273, the terminals are supported by a tine plate at a position near a surface of the wiring board to accurately position the terminals with respect to the lands. However, the terminals may not be accurately positioned with respect to the lands, due to manufacturing variations in the tine plate. Further, since the tine plate is fixed to a connector housing, the terminals may not be accurately positioned with respect to the lands, due to variations in assembly of the tine plate to the connector housing.

In such a through-hole connector with a tine plate, when the length of the terminal between a first portion supported by the tine plate and a second portion soldered to the land of the wiring board is short, the terminal is subjected to a lot of stress. Since the stress can cause disconnection between the terminal and the land, there is a need to increase the length of the terminal between the first and second portions. That is, the length of the terminal between the tine plate and the wiring board needs to be increased to reduce the stress applied to the terminal. As a result, the distance between the tine plate and the wiring board is increased. Accordingly, the size of the connector in a direction perpendicular to the surface of the wiring board is increased.

In the surface-mount connector disclosed in JP-A-2007-179974, the terminals are soldered to the lands on the wiring board by a reflow soldering process. Since a tine plate for supporting the terminals cannot be used in the reflow soldering process, it is difficult to accurately position the terminals with respect to the lands. Further, since the terminals are arranged in a line in the length direction of a connector housing, the distance between adjacent terminals decreases in an increase in the number of the terminals. As a result, crosstalk problems may be likely to occur, when the connector has a large number of terminals.

SUMMARY OF THE INVENTION

In view of the above, it is an object of the present invention to provide a connector configured such that even when the connector has a large number of terminals, the terminals can be accurately positioned with respect to lands of a wiring board, and a crosstalk between adjacent terminals can be reduced. It is another object of the present invention to provide an electronic control apparatus having the connector.

According to an aspect of the present invention, a connector includes a housing and multiple terminals arranged in the housing in a length direction of the housing. The housing of the connector has an electrically insulating property and is adapted to be mounted on a surface of a wiring board having multiple lands. The housing has first and second sides opposite to each other in a width direction of the housing. Each terminal of the connector is exposed to the first side of the housing at one end to be electrically connected to the wiring board and exposed to the second side of the housing at the other end to be electrically connected to an external connector. Each terminal includes a first parallel portion, a joint portion, a second parallel portion, and a contact portion. The first parallel portion is partially supported by the housing and extends substantially parallel to the surface of the wiring board. The second parallel portion is exposed outside the housing and extends substantially parallel to the surface of the wiring board. The second parallel portion is located closer to the surface of the wiring board than the first parallel portion in a direction perpendicular to the surface of the wiring board. The joint portion extends substantially perpendicular to the surface of the wiring board. The joint portion has a first end joined to the first parallel portion and a second end exposed outside the housing and joined to a first end of the second parallel portion. A contact portion has a first end joined to a second end of the second parallel portion and a second end soldered to a corresponding land of the wiring board. The first parallel portions of the terminals are located at X different heights from the surface of the wiring board in a direction perpendicular to the surface of the wiring board, where X is an integer of two or more. The joint portions of the terminals are located at Y different distances from the second side of the housing in the width direction of the housing, where Y is an integer of two or more. A first one of the terminals has the first parallel portion located at a first height from the surface of the wiring board and has the joint portion located at a first distance from the second side of the housing. A second one of the terminals has the first parallel portion located at a second height, less than the first height, from the surface of the wiring board and has the joint portion located at a second distance, different than the first distance, from the second side of the housing. The joint portion of the first one of the terminals is supported by the housing at a position between the first parallel portion of the first one of the terminals and the first parallel portion of the second one of the terminals.

According to another aspect of the present invention, an electronic control apparatus includes the connector and a wiring board having multiple lands. The housing of the connector is placed on the surface of the wiring board. The contact portion of each terminal is soldered to a corresponding land.

BRIEF DESCRIPTION OF THE DRAWINGS

The above and other objectives, features and advantages of the present invention will become more apparent from the following detailed description made with check to the accompanying drawings. In the drawings.

DETAILED DESCRIPTION OF THE PREFERRED EMBODIMENT

An electronic control apparatus 1 according to an embodiment of the present invention is described below with reference to FIGS. 1-9. For example, the electronic control apparatus 1 can be applied to an engine electronic control unit (ECU) of a vehicle. In the embodiment, the electronic control apparatus 1 has a non-waterproof structure.

Figure 1:
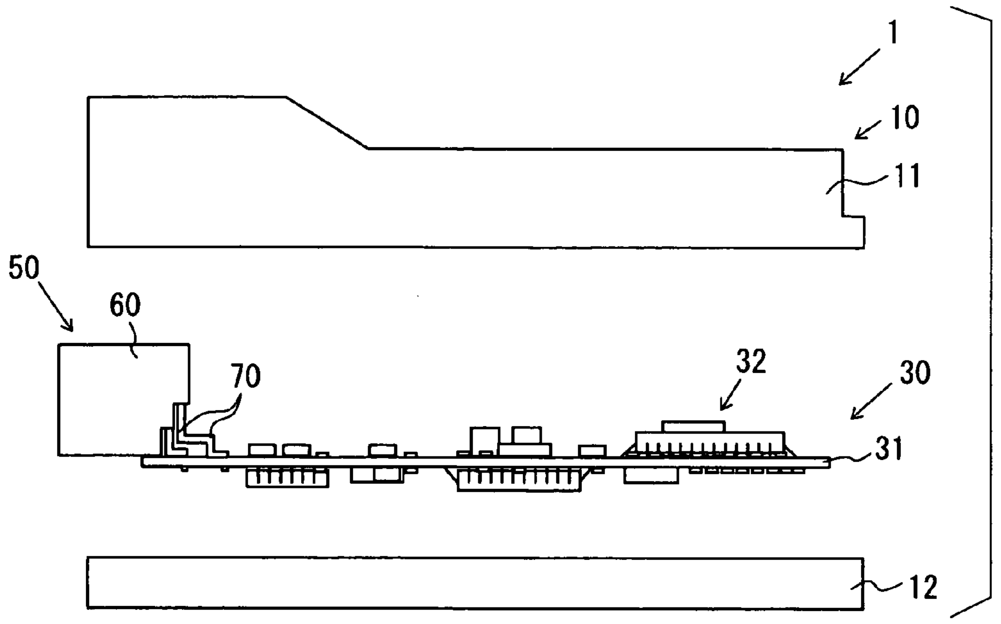
FIG. 1 is a diagram illustrating an exploded view of an electronic control apparatus according to an embodiment of the present invention.

As shown in FIG. 1, the electronic control apparatus 1 mainly includes a circuit board 30 and a connector 50. The circuit board 30 includes a wiring board 31 and electronic devices 32 mounted on the wiring board 31. The connector 50 includes a connector housing 60 and connector terminals 70 supported by the housing 60. In the embodiment, the electronic control apparatus 1 further includes a casing 10 for accommodating the circuit board 30 and the connector 50.

The casing 10 can be, for example, made of a resin material or a metal material such as iron. The casing 10 can be constructed of one piece or separate pieces assembled together. In the embodiment, as shown in FIG. 1, the casing 10 includes a case 11 shaped like a box with an opening and a substantially rectangular lid 12 that covers the opening of the case 11. The case 11 has a connector opening (not shown) shaped to match the housing 60. In a condition where the lid 12 is attached to the case 11, for example, by a screw, while the circuit board 30 is entirely accommodated in the casing 10, the connector 50 is partially exposed outside the casing 10 through the connector opening.

As mentioned above, the circuit board 30 includes the wiring board 31 and the electronic devices 32 mounted on the wiring board 31. The wiring board 31 has wiring patterns (not shown) joined to the electronic devices 32 and via holes (not shown) connecting the wiring patters. Examples of the electronic devices 32 include microcomputers (i.e., microprocessors), power transistors, resistors, and capacitors. The connector 50 is also mounted on the wiring board 31 and configured to electrically connect the circuit board 30 to an external device.

Figure 2:
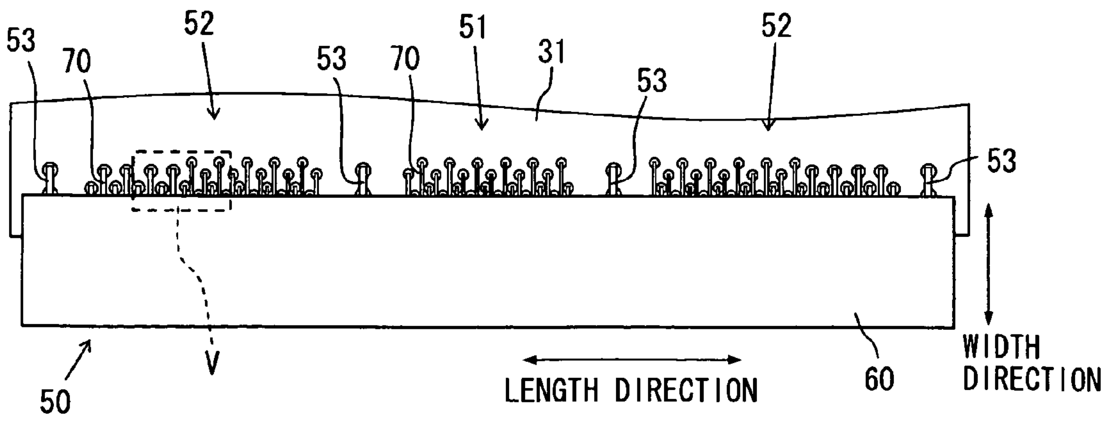
FIG. 2 is a diagram illustrating a top view of a connector mounted on a wiring board of the electronic control apparatus.
Figure 6:
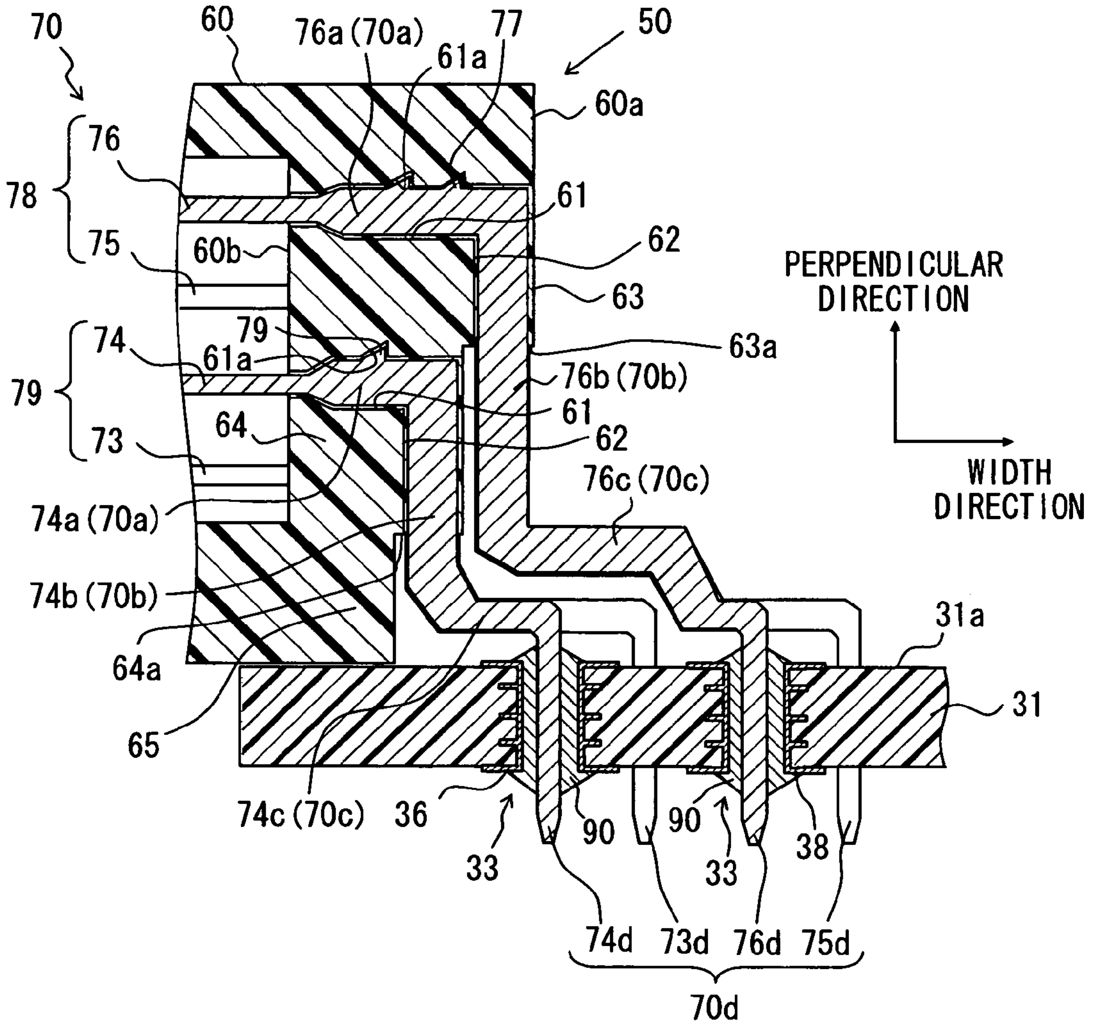
FIG. 6 is a diagram illustrating a cross-sectional view taken along line VI-VI of FIG. 4.

As mentioned above, the connector 50 includes the housing 60 and the terminals 70 supported by the housing 60. The housing 60 is made of an electrically insulating material such as resin. The housing 60 has a substantially rectangular prism shape with length and width directions as indicated in FIG. 2. The connector terminals 70 are made of an electrically conductive material such as copper. As shown in FIG. 6, each connector terminal 70 is exposed at one end to a first side 60*a* of the housing 60 and electrically coupled to the circuit board 30, which is accommodated in the casing 10. Each connector terminal 70 is exposed at the other end to a second side 60*b* of the housing 60 and located outside the casing 10 to be electrically connected to an external connector (not shown).

The connector terminal 70 can be a stamped terminal that is formed by stamping a sheet metal into a predetermined shape. Alternatively, the connector terminal 70 can be a bent terminal that is formed by stamping a metal sheet into a straight shape, inserting the straight-shaped terminal into the housing 60, and then bending the straight-shaped terminal into the predetermined shape. The connector terminal 70 can have an accurate shape, when the connector terminal 70 is a stamped terminal as compared to when the connector terminal 70 is a bent terminal. The connector terminal 70 can be brass plated.

Figure 3:
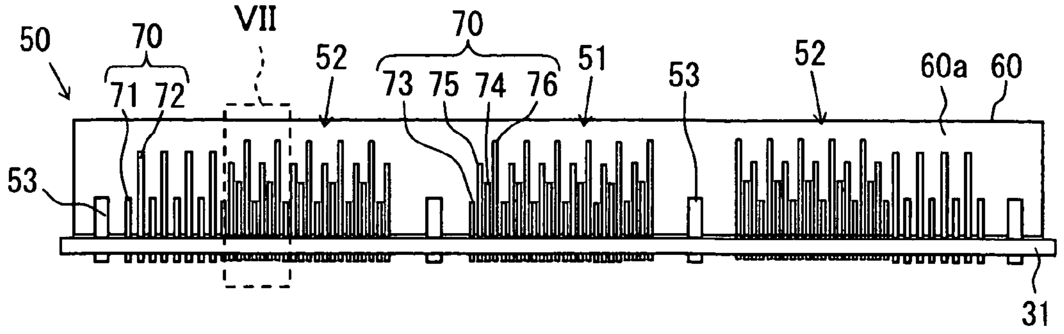
FIG. 3 is a diagram illustrating a first side view of the connector mounted on the wiring board of the electronic apparatus.
Figure 4:
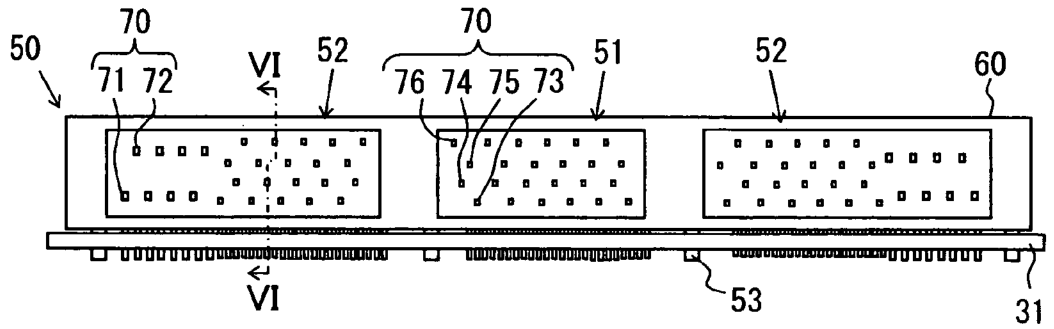
FIG. 4 is a diagram illustrating a second side view of the connector mounted on the wiring board of the electronic apparatus.

As shown in FIGS. 2-4, the connector terminals 70 are supported by the housing 60 and arranged in the length direction of the housing 60 so as not to interfere with each other. In the embodiment, the connector terminals 70 include power terminals 71, 72 and signal terminals 73-76. The power terminals 71, 72 are used for electric power transmission, and the signal terminals 73-76 are used for signal transmission. The power terminals 71, 72 are identical in diameter, and the signal terminals 73-76 are identical in diameter. In other words, the power terminals 71, 72 are identical in cross section, and the signal terminals 73-76 are identical in cross section. A diameter of each of the power terminals 71, 72 is greater than a diameter of each of the signal terminals 73-76.

Figure 5:
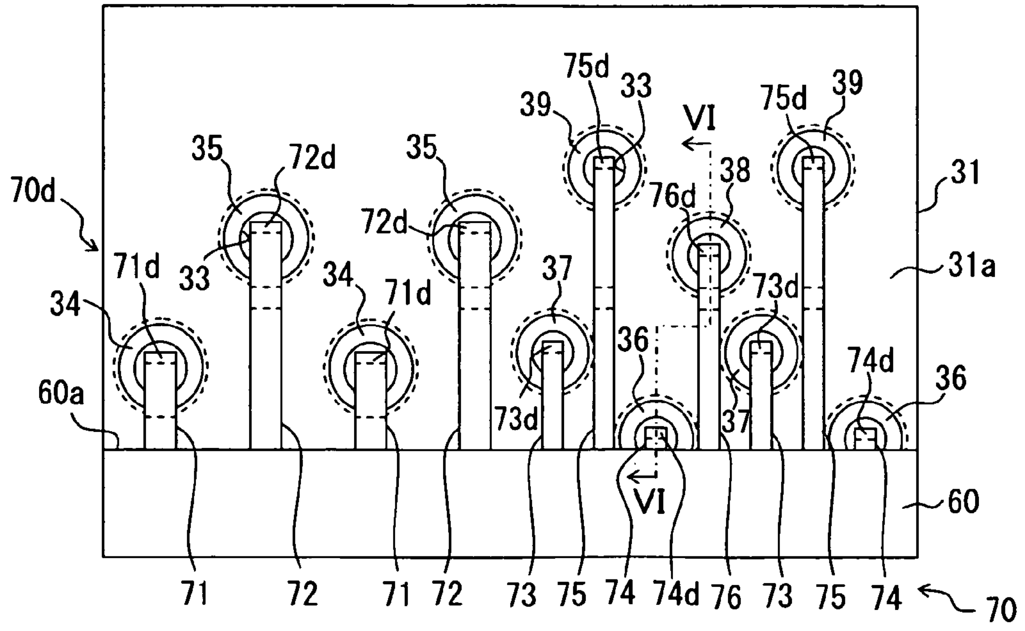
FIG. 5 is a diagram illustrating an enlarged view of a portion enclosed by a line V of FIG. 2.

As shown in FIGS. 5, 6, the wiring board 31 has through holes 33 and conductive lands 34-39. The lands 34-39 are integrally formed on inner walls of the through holes 33 and around openings of the through holes 33, respectively. The through holes 33 penetrate through the wiring board 31 in a direction perpendicular to a surface 31 a of the wiring board 31.

The lands 34-39 correspond to the terminals 71-76, respectively. That is, the terminals 71-76 are inserted into the through holes 33 and electrically joined to the lands 34-39 through solders 90, respectively. The shape and size of the through holes 33 are adjusted to match the terminals 71-76. For example, since the power terminals 71, 72 have the diameter greater than the diameter of the signal terminals 73-76, the through holes 33 for receiving the power terminals 71, 72 have the diameter greater than the diameter of the through holes 33 for receiving the signal terminals 73-76.

The lands 34 for the power terminals 71 are arranged in a line in the length direction of the housing 60. The lands 35 for the power terminals 72 are arranged in a line in the length direction of the housing 60. The land 35 is located farther from the second side 60*b* of the housing 60 than the land 34 in the width direction of the housing 60. The lands 34, 35 are alternately arranged in the length direction of the housing 60 to form a two-legged zigzag arrangement.

The lands 36 for the signal terminals 73 are arranged in a line in the length direction of the housing 60. The lands 37 for the signal terminals 74 are arranged in a line in the length direction of the housing 60. The lands 38 for the signal terminals 75 are arranged in a line in the length direction of the housing 60. The lands 39 for the signal terminals 76 are arranged in a line in the length direction of the housing 60. The land 37 is located farther from the second side 60*b* of the housing 60 than the land 36 in the width direction of the housing 60. The land 38 is located farther from the second side 60*b* than the land 37. The land 39 is located farther from the second side 60*b* than the land 38. The lands 37, 39, 36, 38 are alternately arranged in this order in the length direction of the housing 60 so as to provide a four-legged zigzag arrangement.

Each connector terminal 70 has a first parallel portion 70*a*, a first joint portion 70*b*, a second parallel portion 70*c*, and a contact portion 70*d*. For example, as shown in FIG. 6, the signal terminals 73-76 have first parallel portions 73*a*-76*a*, first joint portions 73*b*-76*b*, second parallel portions 73*c*-76*c*, and contact portions 73*d*-76*d*, respectively. Although not shown in the drawings, the power terminals 71, 72 have first parallel portions 71*a*, 72*a*, first joint portions 71*b*, 72*b*, second parallel portions 71*c*, 72*c*, and contact portions 71*d*, 72*d*.

The first parallel portion 70*a* of the connector terminal 70 extends substantially parallel to the surface 31*a* of the wiring board 31 in the width direction of the housing 60. The first parallel portion 70*a* has a first end that projects from the second side 60*b* of the housing 60 to be electrically connected to the external connector. A second end of the first parallel portion 70*a* is supported by the housing 60.

Specifically, as exemplified in FIG. 6 by the first parallel portions 74*a*, 76*a* of the signal terminals 74, 76, the second end of the first parallel portion 70*a* is placed in a through hole 61 and a slit 62 formed in the housing 60. The through hole 61 penetrates through the housing 60 in the width direction of the housing 60. The slit 62 is formed on the first side 60*a* and extends in the direction perpendicular to the surface 31*a* of the wiring board 31. The upper end of the slit 62 communicates with the through hole 61. In the embodiment, the first parallel portion 70*a* is inserted in the through hole 61 and the slit 62 from the first side 60*a* of the housing 60.

A projection 77 is formed on an outer surface of the second end of the first parallel portion 70*a*, and a recess 61*a* is formed on an inner wall of the through hole 61. When the first parallel portion 70*a* is inserted in the through hole 61, the projection 77 of the first parallel portion 70*a* is received in (i.e., engaged with) the recess 61*a* of the through hole 61 to prevent the first parallel portion 70*a* from moving toward the first side 60*a* of the housing 60. Further, the joint portion 70*b* and a bottom 62*b* (refer to FIG. 8) of the slit 62 prevents the first parallel portion 70*a* from moving toward the second side 60*b* of the housing 60. Thus, the terminal 70 remains supported by the housing 60.

As shown in, for example, FIGS. 3, 4, the first parallel portions 71*a*, 72*a* of the power terminals 71, 72 are located at two different heights from the surface 31*a* of the wiring board 31 in the direction perpendicular to the surface 31*a*. Further, the first parallel portions 71*a*, 72*a* are alternately arranged in the length direction of the housing 60 to form a two-legged zigzag arrangement. Specifically, the first parallel portion 71*a* is located at a first height from the surface 31*a*, and the first parallel portion 72*a* is located at a second height greater than the first height.

As shown in, for example, FIG. 6, the first parallel portions 73*a*-76*a* of the signal terminals 73-76 are located at four different heights from the surface 31*a* of the wiring board 31 in the direction perpendicular to the surface 31*a*. Specifically, the first parallel portion 73*a* is located at a third height from the surface 31*a*, the first parallel portion 74*a* is located at a fourth height greater than the third height, the first parallel portion 75*a* is located at a fifth height greater than fourth height, and the first parallel portion 76*a* is located at a sixth height greater than the fifth height. Further, the first parallel portions 76*a*, 74*a*, 75*a*, and 73*a* are alternately arranged in this order in the length direction of the housing 60 to form a four-legged zigzag arrangement.

As exemplified in FIG. 6 by the second parallel portions 74*c*, 76*c* of the signal terminals 74, 76, the second parallel portion 70*c* is located closer to the surface 31 a of the wiring board 31 than the first parallel portion 70*a* and extends substantially parallel to the surface 31*a* in the width direction of the housing 60. The second parallel portion 70*c* is entirely exposed outside the housing 60 on the first side 60*a* side. The second parallel portion 70*c* has a first end joined to the second end of the joint portion 70*b* and a second end joined to a first end of the contact portion 70*d*. That is, the first and second parallel portions 70*a*, 70*c* are joined together by the joint potion 70*b*.

As exemplified in FIG. 6 by the joint portions 74*b*, 76*b* of the signal terminals 74, 76, the joint portion 70*b* extends substantially perpendicular to the surface 31 a of the wiring board 31. The joint portion 70*b* has a first end joined to the second end of the first parallel portion 70*a* and a second end projecting from the first side 60*a* of the housing 60 toward the surface 31*a* of the wiring board 31. The joint portion 70*b* is partially supported by the housing 60 in such a manner that the second end of the joint portion 70*b* is exposed outside the housing 60. In the embodiment, as shown in, for example, FIGS. 6-9, the first end of the joint portion 70*b* is placed in the slit 62 and thus supported by the housing 60. As clearly illustrated in FIG. 8, the joint portion 70*b* placed in the slit 62 does not touch a plane formed by the first side 60*a*. In such an approach, a foreign matter sticking to the first side 60*a* cannot touch the joint portion 70*b*. Therefore, even when the foreign matter has an electrical conductivity, the foreign matter does not cause a short-circuit between adjacent joint portions 70*b*.

The joint portions 71*b*, 72*b* of the power terminals 71, 72 are located at different distances from the second side 60*b* of the housing 60 in the width direction of the housing 60. Specifically, the joint portion 72*b* is located at a first distance from the second side 60*b*, and the joint portion 71*b* is located at a second distance greater than the first distance.

The joint portions 73*b*, 74*b* of the signal terminals 73, 74 are located at the same distance from the second side 60*b* of the housing 60 in the width direction of the housing 60. The joint portions 75*b*, 76*b* of the signal terminals 75, 76 are located at the same distance from the second side 60*b* of the housing 60 in the width direction of the housing 60. Specifically, each of the joint portions 73*b*, 74*b* is located at a third distance from the second side 60*b*, and each of the joint portions 75*b*, 76*b* is located at a fourth distance greater than the fourth distance. Thus, the joint portions 73*b*-76*b* of the signal terminals 73-76 are located at two different distances from the second side 60*b* of the housing 60 in the width direction of the housing 60.

In the embodiment, the terminals 70 having the same diameter are classified into first and second terminals 78, 79 according to the distance of the joint portion 70*b* from the second side 60*b* of the housing 60. For example, the power terminal 72 and the signal terminals 75, 76 are classified as the first terminal 78, and the power terminal 71 and the signal terminals 73, 74 are classified as the second terminal 79. The joint portion 70*b* of the first terminal 78 is supported by the housing 60 at a position between the first parallel portions 70*a* of the first and second terminals 78, 79.

Specifically, the joint portion 72*b* of the power terminal 72 as the first terminal 78 is supported by the housing 60 at a position between the first parallel portion 72*a* of the power terminal 72 and the first parallel portion 71*a* of the power terminal 71 as the second terminal 79. The joint portion 75*b* of the signal terminal 75 as the first terminal 78 is supported by the housing 60 at a position between the first parallel portion 75*a* of the signal terminal 75 and the first parallel portion 73*a* of the signal terminal 73 as the second terminal 79. The joint portion 76*b* of the signal terminal 76 as the first terminal 78 is supported by the housing 60 at a position between the first parallel portion 76*a* of the signal terminal 76 and the first parallel portion 74*a* of the signal terminal 74 as the second terminal 79.

As shown, for example, in FIG. 6, in the first and second terminals 78, 79 having the same diameter, the second parallel portion 70*c* of the second terminal 79, the second parallel portion 70*c* of the first terminal 78, the first parallel portion 70*a* of the second terminal 79, and the first parallel portion 70*a* of the first terminal 78 are arranged in this order from the surface 31*a* side.

Figure 9:
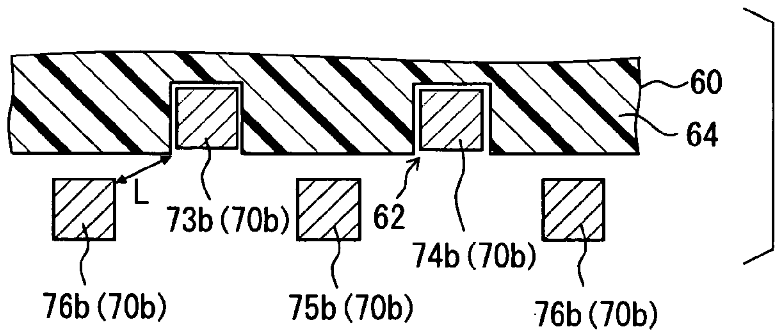
FIG. 9 is a diagram illustrating a cross-sectional view taken along line IX-IX of FIG. 7.

As shown, for example, in FIG. 9, the joint portion 70*b* of the first terminal 78 (i.e., the joint portions 75*b,* 76*b* of the signal terminals 75, 76) and the joint portion 70*b* of the second terminal 79 (i.e., the joint portions 73*b,* 74*b* of the signal terminals 73, 74) are alternately arranged in the length direction of the housing 60 to form a two-legged zigzag arrangement.

The contact portion 70*d* of the terminal 70 is electrically joined to a corresponding one of the lands 34-39 of the wiring board 31. In the embodiment, the wiring board 31 has through holes 33. The lands 34-39 are integrally formed on inner walls of the through holes 33 and formed around openings of the through holes 33. As shown in FIGS. 5 and 6, the contact portions 70*d* are inserted into through holes 33 and electrically joined to the lands 34-39 through solders 90.

As shown in FIG. 5, the contact portions 71*d* of the power terminals 71 are arranged in a line in the length direction of the housing 60. Likewise, the contact portions 72*d* of the power terminals 72 are arranged in a line in the length direction of the housing 60. The contact portion 71*d* of the power terminal 71 as the first terminal 78 is located closer to the second side 61*b* of the housing 60 than the contact portion 72*d* of the power terminal 72 as the first terminal 78. The contact portions 71 d, 72*d* are soldered to the lands 34, 35, respectively, and alternately arranged in the length direction of the housing 60 to form a two-legged zigzag arrangement.

As shown in FIG. 5, the contact portions 73d of the signal terminals 73 are arranged in a line in the length direction of the housing 60. Likewise, the contact portions 74*d* of the signal terminals 74 are arranged in a line in the length direction of the housing 60. Likewise, the contact portions 75*d* of the signal terminals 75 are arranged in a line in the length direction of the housing 60. Likewise, the contact portions 76*d* of the signal terminals 76 are arranged in a line in the length direction of the housing 60. The contact portion 74*d* of the signal terminal 74 as the second terminal 79 is located closer to the second side 61*b* of the housing 60 than the contact portion 73*d* of the signal terminal 73 as the second terminal 79. The contact portion 74*d* of the signal terminal 74 as the second terminal 79 is located closer to the second side 61*b* of the housing 60 than the contact portion 76*d* of the signal terminal 76 as the first terminal 78. The contact portion 76*d* of the signal terminal 76 as the first terminal 78 is located closer to the second side 61*b* of the housing 60 than the contact portion 75*d* of the signal terminal 75 as the first terminal 78. The contact portions 73*d*-76*d* are soldered to the lands 36-39, respectively. Further, the contact portions 73*d,* 75*d,* 74*d,* and 76*d* arranged in this order in the length direction of the housing 60 to form a four-legged zigzag arrangement.

Further, as shown in FIG. 6, the contact portion 70*d* has a cross-section (i.e., diameter) smaller than that of any other portion of the terminal 70 exposed outside housing 60 on the first side 60*a* side. Specifically, the contact portion 70*d* has a cross-section smaller than that of each of the second end of the joint portion 70*b* and the second parallel portion 70c. In such an approach, the size of the through hole 33 is reduced so that the area of the wiring board 31 occupied by the though hole 33 can be reduced. Since each of the joint portion 70*b* and the second parallel portion 70*c* has a large cross section enough to reduce impedance of the terminal 70, heat generated in the terminal 70 is reduced. Further, the large cross section of the joint portion 70*b* and the second parallel portion 70*c* increases strength of the terminal 70 so that a bend of the terminal 70 can be reduced. Therefore, the contact portions 70*d* can be inserted in the through holes 33 while positioning the terminals 70 with respect to the through holes 33.

As shown in FIGS. 2-4, the connector 50 has one first terminal block 51 and two second terminal block 52 that are arranged in a line in the length direction of the housing 60. The first terminal block 51 is constructed with only the signal terminals 73-76. Each second terminal block 52 is constricted with both the power terminals 71, 72 and the signal terminals 73-76. In the embodiment, the first and second terminal blocks 51-52 are respectively mated with three external connectors of an electrical system of an engine of the vehicle. As shown in FIG. 4, the first and second terminal blocks 51-52 are separated from each other by the second side 60*b* of the housing 60. In such an approach, the housing 60 can be prevented from warping in the length direction. The arrangement of the terminal blocks and the arrangement of the terminals in the terminal block can vary according to the intended use, for example, as disclosed in Japanese Patent Application No. 20007-000888, which is filed by the present inventor.

In the embodiment, as shown in FIGS. 2, 3, the housing 60 is fixed to the wiring board 31 by four reinforcement pins 53 that are arranged in a line in the length direction of the housing 60 at a given interval. In such an approach, the connector 50 can be reliably fixed to the wiring board 31. The number and arrangement of the reinforcement pins 53 can vary according to the intended use. Alternatively, the reinforcement pins 53 can be unnecessary, because the connector 50 can be securely fixed to the wiring board 31 by the contact portions 70d, which are inserted in the through holes 33 and soldered to the lands 34-39 of the wiring board 31.

In summary, the following advantages can be achieved according to the embodiment. The first end of the joint portion 70*b* is joined to the first parallel portion 70*a,* and the second end of the joint portion 70*b* is joined to the second parallel portion 70c. As shown in FIG. 6, the first end of the joint portion 70*b* is supported by the housing 60, and the second end of the joint portion 70*b* is exposed outside the housing 60. That is, the second parallel portion 70*c* and the second end of the joint portion 70*b* are located between the contact portion 70*d* and the first end of the joint portion 70*b.* In such an approach, the length of the terminal 70 between the first side 60*a* of the housing 60 and the surface 31 a of the wiring board 31 becomes long enough to reduce stress applied to the terminal 70. Thus, connection reliability between the terminals 70 and the lands 34-39 can be ensured without increasing the size of the connector 50 in the direction perpendicular to the surface 31 a of the wiring board 31.

In particular, in the embodiment, the joint portion 70*b* of the first terminal 78 is supported by the housing 60 at a position between the first parallel portion 70*a* of the first terminal 78 and the first parallel portion 70*a* of the second terminal 79. That is, the joint portion 70*b* of the first terminal 78 is supported by the housing 60 at a position relatively far away from the surface 31 a of the wiring board 31 in the direction perpendicular to the surface 31*a.* Therefore, the connection reliability can be effectively increased.

Further, in the embodiment, the first end of the joint portion 70*b* of the terminal 70 is covered with the housing 60. For example, the length of the first end of the joint portion 70*b* can account for from about one-third to two-thirds of the total length of the joint portion 70*b*. In such an approach, the joint portion 70*b* is supported by the housing 60 at a position relatively far away from the surface 31 a of the wiring board 31 in the direction perpendicular to the surface 31*a*. Thus, the connection reliability between the terminals 70 and the lands 34-39 can be increased without increasing the size of the connector 50 in the direction perpendicular to the surface 31*a*. Since a top side (i.e., the first end) of the joint portion 70*b* is supported by the housing 60, the housing 60 can be simplified in structure as compared to when a bottom side (i.e., the second end) of the joint portion 70*b* is supported by the housing 60. Further, since the joint portion 70*b* is supported by a surface of the housing 60, not a point of the housing 60, the terminals 70 can be accurately positioned with respect to the lands 34-39.

Figure 7:
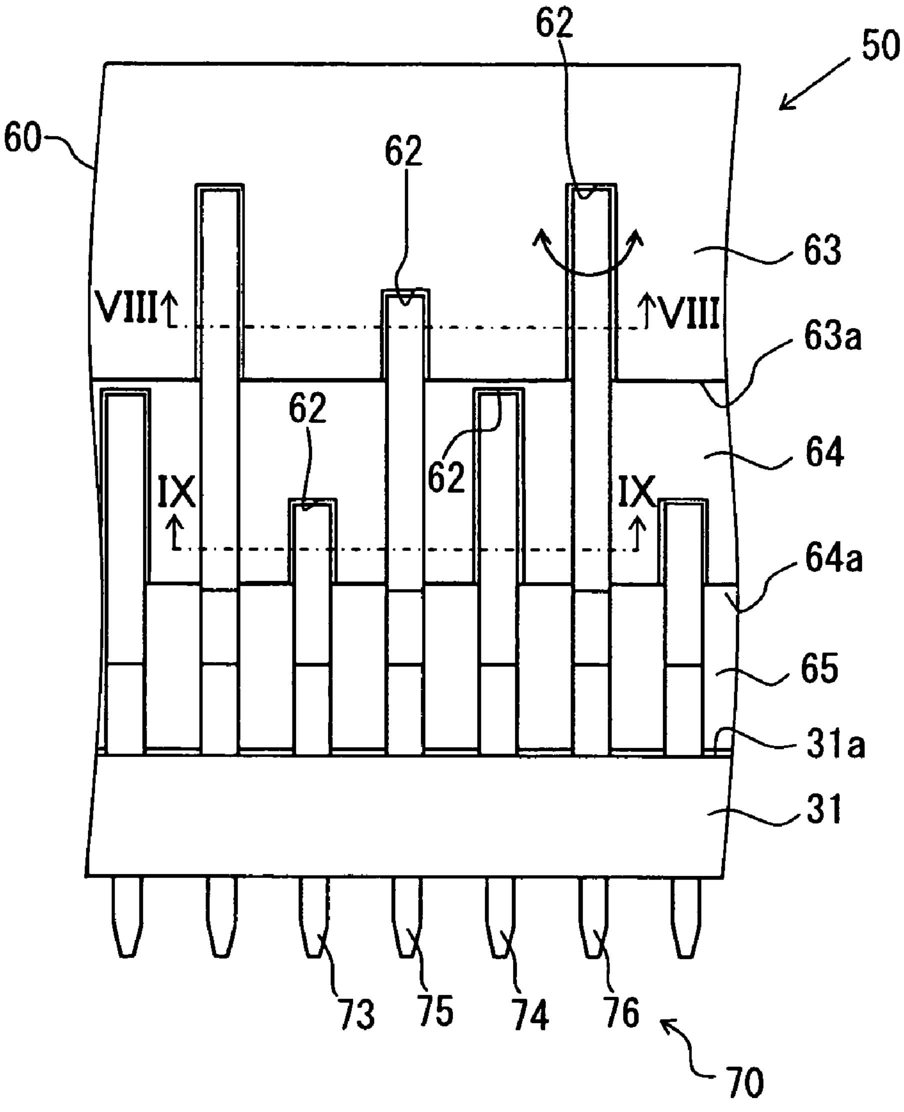
FIG. 7 is a diagram illustrating an enlarged view of a portion enclosed by a line VII of FIG. 3.

Specifically, as shown in FIGS. 6, 7, the housing 60 has a thick portion 63 and a thin portion 64. The thickness of the thick portion 63 in the width direction of the housing 60 is greater than the thickness of the thin portion 64. The first parallel portion 70*a* and the first end of the joint portion 70*b* of the first terminal 78 (i.e., the power terminal 72 and the signal terminals 75, 76) are supported by the thick portion 63. The first parallel portion 70*a* and the first end of the joint portion 70*b* of the second terminal 79 (i.e., the power terminal 71 and the signal terminals 73, 74) are supported by the thin portion 64. Due to the thickness difference between the thick portion 63 and the thin portion 64, the housing 60 has a stepped shape at the first side 60*a*. The second end of the joint portion 70*b* of the first terminal 78 projects from a bottom 63*a* of the thick portion 63 and is located in front of the first side 60*a* of the thin portion 64 with a space therebetween. The second end of the joint portion 70*b* of the second terminal 79 projects from a bottom 64*a* of the thin portion 64 and is located in front of the first side 60*a* of a further thin portion 65 with a space therebetween. The thickness of the further thin portion 65 in the width direction of the housing 60 is smaller than the thickness of the thin portion 64. In this way, the top side (i.e., the first end) of the joint portion 70*b* of each terminal 70 is supported by the housing 60.

Figure 8:
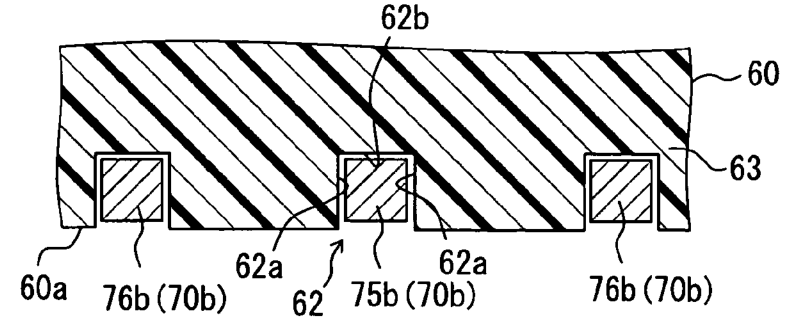
FIG. 8 is a diagram illustrating a cross-sectional view taken along line VIII-VIII of FIG. 7.

As shown in FIGS. 6-9, the first end of the joint portion 70*b* is placed in the slit 62 formed on the first side 60*a* of the housing 60. For example, as shown in FIG. 8, opposing side walls 62*a* of the slit 62 prevent the joint portion 70*b* from being displaced in the length direction of the housing 60. Accordingly, a rotational movement of the terminal 70 around the first parallel portion 70*a* is prevented. The rotational movement is indicated by a solid arrow in FIG. 7. Therefore, the terminals 70 (i.e., the contact portions 70*d*) can be accurately positioned with respect to the lands 34-39 without using a tine plate.

As shown, for example, in FIG. 6, the first parallel portions 70*a* are located at different heights from the surface 31*a* of the wiring board 31. Further, the joint portions 70*b* are located at different distances from the second side 60*b* of the housing 60. In this case, a distance between adjacent joint portions 70*b* is long compared to when the joint portions 70*b* are located at the same distance from the second side of the housing 60. Accordingly, crosstalk between adjacent terminals 70 is less likely to occur. Therefore, the number of the terminals 70 can be increased without increasing the size of the housing 60 in the length direction.

As describe above, according to the embodiment, the connector 50 can have a large number of the terminals 70 without increasing the size. The terminals 70 can be accurately positioned with respect to the lands 34-39 and reliably connected to the lands 34-39. The connector 50 is mounted on the circuit board 30 in such a manner that the contact portions 70*d* of the terminals 70 are located perpendicular to the surface 31*a* of the wiring board 31, inserted in the through holes 33, and soldered to the lands 34-39 that are formed on the inner walls of the through holes 33 and around the openings of the through holes 33. That is, the connector 50 is configured as a through hole connector. Although the connector 50 is configured as a through hole connector, the terminals 70 can be accurately positioned with respect to the lands 34-39 without using a tine plate. Further, the terminals 70 can be reliably connected to the lands 34-39 without increasing the size of the connector 50 in the direction perpendicular to the surface 31 a of the wiring board 31.

Further, according to the embodiment, as shown, for example, in FIG. 6, the second parallel portion 70*c* of the second terminal 79, the second parallel portion 70*c* of the first terminal 78, the first parallel portion 70*a* of the second terminal 79, and the first parallel portion 70*a* of the first terminal 78 are arranged in this order from the surface 31 a side. That is, the second parallel portion 70*c* of the first terminal 78 is located closer to the surface 31 a than the first parallel portion 70*a* of the second terminal 79. In such an approach, the length of a portion (e.g., contact portion 70*d*) of the first terminal 78 located closer to the surface 31*a* than the second parallel portion 70*c* can be reduced. Therefore, although the first parallel portion 70*a* of the first terminal 78 is located farther from the surface 31*a* of the wiring board 31 than the first parallel portion 70*a* of the second terminal 79, the first terminal 78 can be accurately positioned with respect to the lands 35, 38, 39.

In the embodiment, the signal terminals 73-76 are identical in cross-section (i.e., diameter). The joint portions 70*b* of the signal terminals 73-76 are located at X different distances from the second side 60*b* of the housing 60, where X is two. Specifically, each of the joint portions 73*b*, 74*b* is located at the third distance from the second side 60*b*, and each of the joint portions 75*b*, 76*b* is located at the fourth distance greater than the fourth distance. On the other hands, the first parallel portions 70*a* of the signal terminals 73-76 are located at Y different heights from the surface 31*a* of the wiring board 31, where Y is four. Specifically, the first parallel portion 73*a* is located at the third height from the surface 31*a*, the first parallel portion 74*a* is located at the fourth height greater than the third height, the first parallel portion 75*a* is located at the fifth height greater than fourth height, and the first parallel portion 76*a* is located at the sixth height greater than the fifth height.

In summary, the different distance step X (two) of the joint portions 70*b* is less than the different height step Y (four) of the first parallel portions 70*a* (i.e., $2 \leqq X < Y$). In such an approach, although the terminal 70 has the second parallel portion 70*c* extending in the width direction of the housing 60, the increase in the size of the connector 50 in the width direction can be prevented. In particular, in the embodiment, the different height step Y of the first parallel portions 70*a* is a multiple of the different distance step X of the joint portions 70*b*. Therefore, the connector 50 can have a large number of terminals 70 while preventing crosstalk between the adjacent terminals 70. Further, the contact portions 70*d* of the signal terminals 73-76 are located at Z different distances from the second side 60*b* of the housing 60, where Z is four. Specifically, the contact portion 74*d* is located closer to the second side 61*b* than the contact portion 73*d*, the contact portion 74*d* is located closer to the second side 61*b* than the contact portion 76*d,* and the contact portion 76*d* is located closer to the second side 61*b* than the contact portion 75*d.*

In summary, the different distance step X (two) of the joint portions 70*b* is less than the different distance step Z (four) of the contact portions 70*d* (i.e., 2≦X<Z). In such an approach, although the terminal 70 has the second parallel portion 70*c* extending in the width direction of the housing 60, the increase in the size of the connector 50 in the width direction can be prevented. The distance between adjacent terminals 70 can be increased by increasing the different distance step Z. Accordingly, the crosstalk between adjacent terminals can be reduced. Further, the widths of the lands 36-39 can be increased by increasing the different distance step Z to improve the connection reliability between the terminals 73-76 and the lands 36-39. The above-described requirements (e.g., 2≦X<Y, 2≦X<Z) can be applied to terminals 70 other than the signals terminals 73-76, as long as the terminals 70 are identical in cross-section. For example, the above-described requirements can be applied to the power terminals 71, 72.

According to the embodiment, the contact portions 70*d* of the terminals 70 having the same diameter are arrange in a zigzag manner. In such an approach, the crosstalk between adjacent terminals 70 can be reduced. Further, the widths of the lands 34-39 can be increased so that the connection reliability between the terminals 70 and the lands 34-39 can be improved. Furthermore, as compared to when the lands 34-39 are arranged in a line in the length direction of the housing 60, the size of the wiring board 31 in the length direction can be reduced.

According to the embodiment, the terminals 70 are classified into the first and second terminals 78, 79 according to the distance of the joint portion 70*b* from the second side 60*b* of the housing 60. The power terminal 72 and the signal terminals 75, 76 are classified as the first terminal 78, and the power terminal 71 and the signal terminals 73, 74 are classified as the second terminal 79. In each of the first and second terminals 78, 79 having the same diameter, the terminal 70 having the first parallel portion 70*a* located father from the surface 31*a* of the wiring board 31 has the contact portion 70*d* located closer to the second side 60*b* of the housing 60. In other words, in each of the first and second terminals 78, 79 having the same diameter, the terminal 70 having the first parallel portion 70*a* located closer to the surface 31 a has the contact portion 70*d* located farther from the second side 60*b*. In such an approach, each first terminal 78 having the same diameter has substantially the same length, and the second terminals 79 having the same diameter has substantially the same length. For example, in the example shown in FIG. 6, the signal terminals 75, 76 as the first terminal 78 has substantially the same length. Accordingly, each first terminals 78 has substantially the same impedance, and each second terminal 79 has substantially the same impedance. Therefore, a local increase of temperature in the terminals 70 can be reduced.

According to the embodiment, in the terminals 70 having the same diameter, the joint portion 70*b* of the first terminal 78 and the joint portion 70*b* of the second terminal 79 are arranged in the length direction of the housing 60 to form a zigzag arrangement. In such an approach, a distance L (refer to FIG. 9) between adjacent terminals 70 can be increased so that the crosstalk between the adjacent terminals 70 can be reduced. Further, as compared to a grid arrangement, the zigzag arrangement can allow a visual inspection for a solder joint between the contact portion 70*d* located closer to the housing 60 and the corresponding land to be easily performed.

(Modifications)

The embodiment described above can be modified in various ways. For example, although the terminals 70 have two types of power terminals 71, 72 and four types of signal terminals 73-76, the number of types of the terminals 70 can vary according to the intended use of the connector 50. For example, the terminals 70 can have one type of the terminals 70 having the same diameter or more than three types of the terminals 70 having the same diameter. The different distance step X of the joint portions 70*b,* the different height step Y of the first parallel portions 70*a,* and the different distance step Z of the contact portions 70*d* can vary according to the intended use, as long as each of the different distance step X and the different height step Y is two or more.

In the embodiment, the electronic control apparatus 1 is not made waterproof. Alternatively, the electronic control apparatus 1 can be made waterproof.

Figure 10:
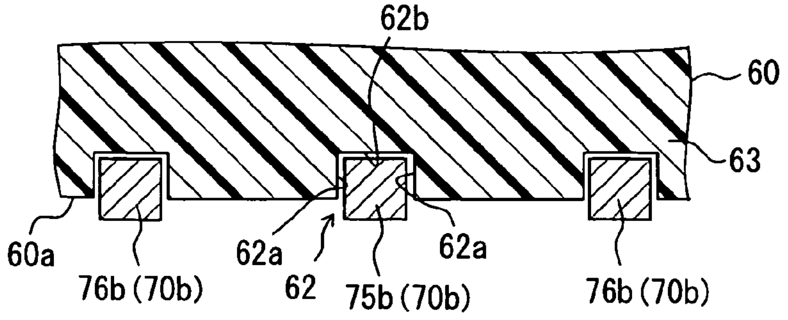
FIG. 10 is a diagram illustrating a cross-sectional view of an electronic control apparatus according to a modification of the embodiment.

In the embodiment, as shown in FIG. 9, the joint portion 70*b* is placed in the slit 62 not to be exposed to the plane formed by the first side 60*a*. Alternatively, as shown in FIG. 10, the joint portion 70*b* can be placed in the slit 62 to be exposed to the plane formed by the first side 60*a*.

Figure 11:
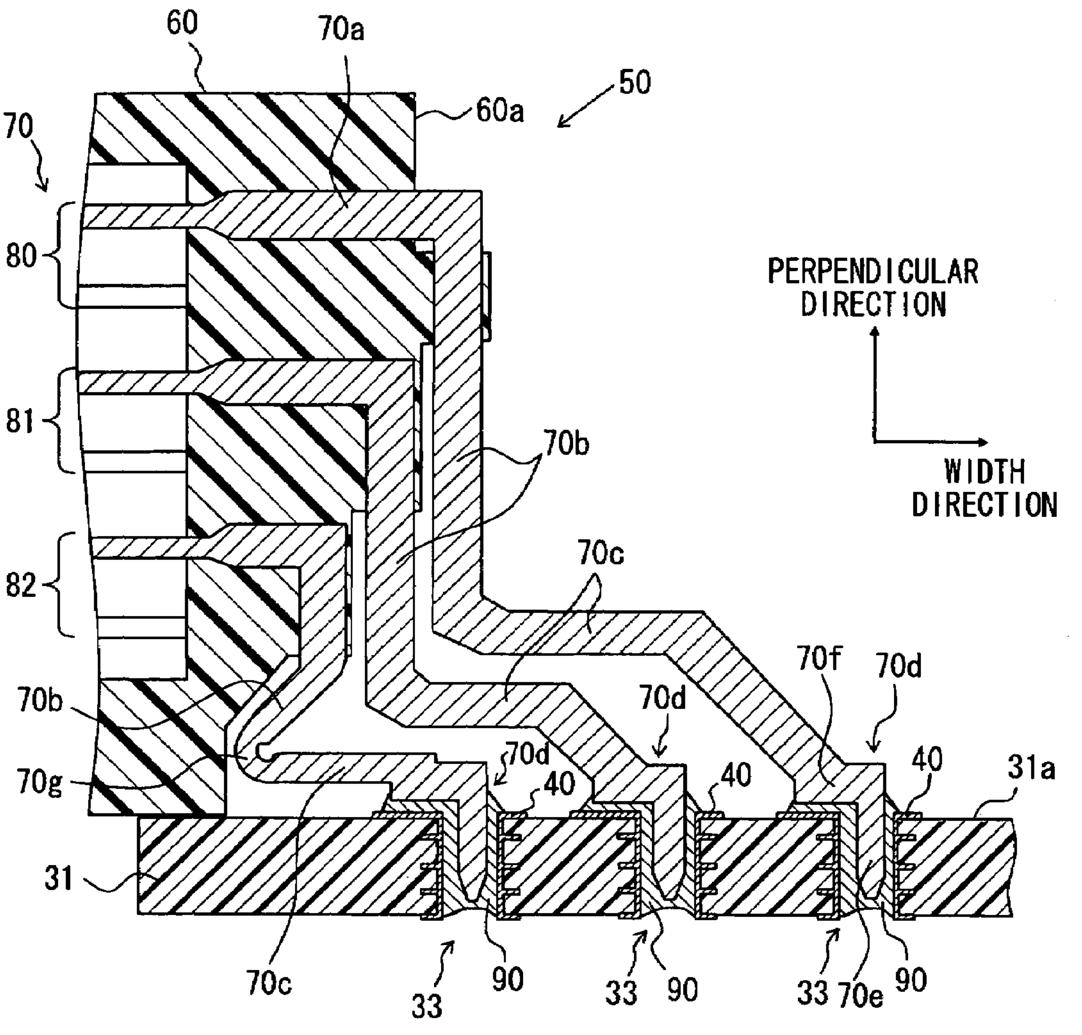
FIG. 11 is a diagram illustrating a cross-sectional view of an electronic control apparatus according to another modification of the embodiment.

In the embodiment, the first end of the joint portion 70*b* is joined to the second end of the first parallel portion 70*a* and supported by the housing 60. In short, the joint portion 70*b* is supported by the housing 60 at a joint between the first parallel portion 70*a* and the joint portion 70*b.* Alternatively, the joint portion 70*b* can be supported by the housing 60 at a portion other than the joint between the first parallel portion 70*a* and the joint portion 70*b.* For example, as shown in FIG. 11, the joint portion 70*b* can be supported by the housing 60 at a portion located away from the joint between the first parallel portion 70*a* and the joint portion 70*b.* In such an approach, the joint between the first parallel portion 70*a* and the joint portion 70*b* are exposed outside the housing. Therefore, the terminals 70 can be easily inserted in the housing 60.

In the embodiment, the contact portion 70*d* has an insertion portion that is inserted into the through hole 33 of the wiring board 31 and soldered to the corresponding land in the through hole 33 using a point soldering method. Alternatively, the contact portion 70*d* can have both the insertion portion and a surface-mount portion that is soldered to the corresponding land on the surface 31*a* using a reflow soldering method. Alternatively, the contact portions 70*d* can have only the surface-mount portion.

The contact portions 70*d* having the surface-mount structure can be mounted on the wiring board by a reflow soldering method. When the second parallel portion 70*c* of the first terminal 78 is located closer to the surface 31*a* of the wiring board 31 than the first parallel portion 70*a* of the second terminal 79, reflow heat is effectively supplied to the contact portion 70*d* of the second terminal 79 without being blocked by the first terminal 78, so that the connection reliability between the terminal 79 and the corresponding land can be increased. Therefore, as shown in FIG. 6, it is preferable that the second parallel portion 70*c* of the second terminal 79, the second parallel portion 70*c* of the first terminal 78, the first parallel portion 70*a* of the second terminal 79, and the first parallel portion 70*a* of the first terminal 78 be arranged in this order from the surface 31*a* side. Further, in the terminals 70 having the same diameter, it is preferable that the first joint portion 70*b* of the first terminal 78 and the first joint portion 70*b* of the second terminal 79 are arranged in the length direction of the housing 60 to form a zigzag arrangement. In such an approach, the reflow heat is effectively supplied to the contact portion 70*d* of the second terminal 79 without being blocked by the joint portion 70*b* of the first terminal 78, so that the connection reliability between the terminal 79 and the lands can be increased. Further, the zigzag arrangement can reduce the crosstalk between adjacent terminals 70 and can allow a visual inspection for the solder joint between the contact portion 70*d* of the second terminal 79 and the corresponding land to be easily performed.

In the example shown in FIG. 11, the contact portion 70*d* has both an insertion portion 70*e* and a surface-mount portion 70*f*. The surface-mount portion 70*f* extends substantially parallel to the surface 31*a* of the wiring board 31 in the width direction of the housing 60. The insertion portion 70*e* extends perpendicular to the surface 31*a* of the wiring board 31 from a tip of the surface-mount portion 70*f* and inserted in the through hole 33 of the wiring board 31.

For example, the terminal 70 can be a stamped terminal that is formed by stamping a sheet metal into a shape corresponding to the terminal 70. Alternatively, the terminal 70 can be formed by stamping a sheet metal into a straight shape and then by bending the straight-shaped sheet metal into the corresponding shape. When the terminal 70 is the stamped terminal, design flexibility of the terminal 70 is improved so that the terminal 70 can have a complex shape. For example, the insertion portion 70*e* can extend perpendicular to the surface 31*a* of the wiring board 31 from a potion other than the tip of the surface-mount portion 70*f*. Specifically, as disclosed in, for example, Japanese Patent Application No. 2007-148613 filed by the present inventor, the insertion portion 70*e* can extend perpendicular to the surface 31*a* of the wiring board 31 from a middle potion of the surface-mount portion 70*f*.

Further, in the example shown in FIG. 11, the terminal 70 includes six types of signal terminals. The first parallel portions 70*a* of the signal terminals are located at six different heights from the surface 31*a* of the wiring board 31. That is, the first parallel portions 70*a* of the signal terminals are located at different heights, respectively. The joint portions 70*b* of the signal terminals are located at three different distances from the second side 60*b* of the housing 60 in the width direction of the housing 60. Specifically, the joint portions 70*b* of the upper two signal terminals are located at the same distance from the second side 60*b*, the joint portions 70*b* of the middle two signal terminals are located at the same distance from the second side 60*b*, and the joint portions 70*b* of the lower two signal terminals are located at the same distance from the second side 60*b*.

The signal terminals are classified into first, second, and third terminals 80-82 according to the distance of the joint portion 70*b* from the second side 60*b*. Each first parallel portion 70*a* of the first terminal 80 is located farther from the surface 31 a than each first parallel portions 70*a* of the second terminal 81. Each first parallel portion 70*a* of the second terminal 81 is located farther from the surface 31 a than each first parallel portions 70*a* of the third terminal 82. Each joint portion 70*b* of the third terminal 82 has a straight portion and a C-shaped portion. The straight portion is joined to the first parallel portion 70*a*, supported by the housing 60, and extends perpendicular to the surface 31*a*. The C-shaped portion is exposed outside the housing 60, located closer to the second side 60*b* of the housing 60 than the straight portion, and joined between the straight portion and the second parallel portion 70*c*. In such an approach, the length of the third terminal 82 is increased so that the connection reliability between the third terminal 82 and lands 40 can be improved. Further, a vertex 70*g* of the C-shaped portion is thinned. The thinned vertex 70*g* reduces stress applied to the solder joint between the third terminal 70 and the land 40 so that the connection reliability between the third terminal 70 and the land 40 can be improved. Since only the vertex 70*g* is thinned, an increase in impedance of the third terminal 82 is kept as low as possible. The first and second terminals can have the C-shaped portion, for example, between the first joint portion 70*b* and the second parallel portion 70*c*.

In the embodiment, the joint portions 70*b* are arranged in the width direction of the housing 60 to from a zigzag arrangement. Alternatively, the joint portions 70*b* can be arranged in a manner other than a zigzag manner. For example, the joint portions 70*b* can be arranged in a grid manner.

The through hole 33 can be replaced with a blind hole that is not exposed to a back surface, opposite to the surface 31*a*, of the wiring board 31.

Such changes and modifications are to be understood as being within the scope of the present invention as defined by the appended claims.

What is claimed is:

1. A connector comprising:

a housing having an electrically insulating property and adapted to be mounted on a surface of a wiring board with a plurality of lands, the housing having first and second sides opposite each other in a width direction thereof; and a plurality of terminals arranged in the housing in a length direction of the housing, each terminal being exposed to the first side of the housing at one end to be electrically connected to the wiring board and exposed to the second side of the housing at an other end to be electrically connected to an external connector, each terminal comprising:

a first parallel portion partially supported by the housing and substantially parallel to the surface of the wiring board;

a second parallel portion exposed outside the housing and substantially parallel to the surface of the wiring board, the second parallel portion being located closer to the surface of the wiring board than the first parallel portion in a direction perpendicular to the surface of the wiring board;

a joint portion substantially perpendicular to the surface of the wiring board, the joint portion having a first end joined to the first parallel portion and a second end exposed outside the housing and joined to a first end of the second parallel portion; and a contact portion having a first end joined to a second end of the second parallel portion and a second end soldered to a corresponding land of the wiring board, wherein the first parallel portions of the plurality of terminals are located at X different heights from the surface of the wiring board in the direction perpendicular to the surface of the wiring board, where X is an integer of two or more, wherein the joint portions of the plurality of terminals are located at Y different distances from the second side of the housing in the width direction of the housing, where Y is an integer of two or more, wherein a first one of the plurality of terminals has the first parallel portion located at a first height from the surface of the wiring board and the joint portion located at a first distance from the second side of the housing, wherein a second one of the plurality of terminals has the first parallel portion located at a second height, less than the first height, from the surface of the wiring board, and the joint portion located at a second distance, different than the first distance, from the second side of the housing, and wherein the joint portion of the first one of the plurality of terminals is supported by the housing at a position between the first parallel portion of the first one of the plurality of terminals and the first parallel portion of the second one of the plurality of terminals.

2. The connector according to claim 1, wherein at least one of the joint portions of the plurality of terminals is covered with the housing over a predetermined length from the first end of the at least one of the joint portions.

3. The connector according to claim 1, wherein the first distance between the second side of the housing and the joint portion of the first one of the plurality of terminals is greater than the second distance between the second side of the housing and the joint portion of the second one of the plurality of terminals.

4. The connector according to claim 1, wherein the first one of the plurality of terminals has the second parallel portion located at a third height from the surface of the wiring board, wherein the second one of the plurality of terminals has the second parallel portion located at a fourth height from the surface of the wiring board, and wherein the third height is less than the second height and greater than the fourth height.

5. The connector according to claim 1, wherein the integer Y is greater than the integer X.

6. The connector according to claim 5, wherein at least some of the plurality of terminals are identical in cross-section, and wherein in the at least some of the plurality of terminals, the integer Y is a multiple of the integer X.

7. The connector according to claim 1, wherein the contact portions of the plurality of terminals are located at Z different distances from the second side of the housing in the width direction of the housing, where Z is an integer of two or more, and wherein the integer Z is greater than the integer X.

8. The connector according to claim 1, wherein the contact portions of the plurality of terminals are arranged in a zigzag manner.

9. The connector according to claim 1, wherein at least one of the first and second ones of the plurality of terminals comprises a plurality of terminals, wherein a first one of the plurality of terminals of the at least one of the first and second ones has the first parallel portion located at a third height from the surface of the wiring board and the contact portion located at a third distance from the second side of the housing, and wherein a second one of the plurality of terminals of the at least one of the first and second ones has the first parallel portion located at a fourth height, less than the third height, from the surface of the wiring board and the contact portion located at a fourth distance, greater than the third distance, from the second side of the housing.

10. The connector according to claim 1, wherein the joint portions of the first and second ones of the plurality of terminals are arranged in a zigzag manner in the length direction of the housing.

11. The connector according to claim 1, wherein the contact portion of at least one of the plurality of terminals has an insertion portion extending perpendicular to the surface of the wiring board, and wherein the insertion portion is adapted to be received in a hole formed in the surface of the wiring board and electrically joined to the land in the hole.

12. The connector according to claim 11, wherein the contact portion of the at least one of the plurality of terminals has a minimum cross section at the insertion portion, and wherein a cross section of the insertion portion is smaller than a cross section of each of the second parallel portion and the second end of the joint portion of the at least one of the plurality of terminals.

13. The connector according to claim 11, wherein the contact portion of the at least one of the plurality of terminals has a surface-mount portion extending parallel to the surface of the wiring board, wherein the surface-mount portion is located closer to the surface of the wiring board than the second parallel portion of the at least one of the plurality of terminals in a direction perpendicular to the surface of the wiring board, and wherein the surface-mount portion is adapted to be electrically joined to the land around an opening of the hole.

14. The connector according to claim 1, wherein the contact portion of at least one of the plurality of terminals has a surface-mount portion extending parallel to the surface of the wiring board, wherein the surface-mount portion is located closer to the surface of the wiring board than the second parallel portion of the at least one of the plurality of terminals in a direction perpendicular to the surface of the wiring board, and wherein the contact portion is adapted to be electrically joined to the land.

15. The connector according to claim 1, wherein the housing has a slit on the first side and a through hole extending from the first side to the second side to communicate with the slit, a wall of the through hole having a recess, wherein the joint portion of each terminal is at least partially located in the slit of the housing, wherein the first parallel portion of each terminal has a projection and located in the through hole of the housing, and wherein the projection is received in the recess to prevent the first parallel portion to be displaced toward the first side of the housing.

16. The connector according to claim 1, wherein each terminal is a single piece of metal formed from sheet metal by stamping.

17. An electronic control apparatus comprising:

a wiring board having a plurality of lands; and the connector defined in claim 1, wherein the housing of the connector is placed on a surface of the wiring board, and wherein the contact portion of each terminal is soldered to a corresponding land.

* * * * *